United States Patent [19]

Hagiwara et al.

[11] 4,270,220
[45] May 26, 1981

[54] ELECTRONIC TUNING TYPE TELEVISION RECEIVER

[75] Inventors: Yoshimune Hagiwara, Kodaira; Terumi Sawase, Hachioji; Atsushi Takai, Musashino; Yuzo Kita, Fuchu; Akira Honda, Ome, all of Japan

[73] Assignee: Hitachi, Ltd., Tokyo, Japan

[21] Appl. No.: 70,817

[22] Filed: Aug. 29, 1979

[30] Foreign Application Priority Data

Sep. 1, 1978 [JP] Japan .............................. 53-106212

[51] Int. Cl.³ .............................................. H04B 1/26
[52] U.S. Cl. .................................. 455/182; 455/186; 455/195
[58] Field of Search ............... 455/179, 180, 182, 185, 455/186, 195; 358/191.1

[56] References Cited

U.S. PATENT DOCUMENTS

| | | | |
|---|---|---|---|
| 3,928,808 | 12/1975 | Evans | 455/186 |
| 3,999,131 | 12/1976 | Fukuda et al. | 455/186 |
| 4,085,371 | 4/1978 | Mogi et al. | 455/186 |
| 4,152,654 | 5/1979 | Tanaka | 455/185 |
| 4,220,922 | 9/1980 | Ikeguchi | 455/182 |

Primary Examiner—Jin F. Ng
Attorney, Agent, or Firm—Craig and Antonelli

[57] ABSTRACT

A television receiver of electronic tuning type employing a variable capacitance diode in a local oscillator of its tuning circuit, which comprises a memory storing a plurality of digital data indicative of tuning voltages corresponding to a plurality of channels respectively so that a tuning voltage corresponding to a selected channel can be applied to the variable capacitance diode in the tuning circuit, a D/A converter converting a digital data corresponding to a selected channel into an analog voltage to be supplied to the variable capacitance diode, and a tuning voltage control circuit which functions to sequentially modify, at a predetermined rate, the digital data of the selected channel read out from the memory until the tuning point is reached in the tuning circuit, and which applies sequentially such a signal to the D/A converter, whereby the tuning circuit can be tuned to the selected channel regardless of secular and other variations in the operating characteristic of the variable capacitance diode.

3 Claims, 5 Drawing Figures

ELECTRONIC TUNING TYPE TELEVISION RECEIVER

BACKGROUND OF THE INVENTION

This invention relates to a television receiver of electronic tuning type.

In a television receiver of electronic tuning type, a local oscillator in its tuning circuit includes a variable capacitance diode, and a tuning voltage corresponding to a specific channel selected by a TV viewer is applied to this variable capacitance diode so that the tuning circuit can be tuned to the selected channel frequency. In the television receiver of this type, a plurality of digital data indicative of tuning voltage values corresponding to a plurality of channels respectively are stored previously in a tuning data memory, and a digital data corresponding to a specific channel selected by a TV viewer is read out from the memory to be subjected to D/A conversion in a D/A converter thereby providing an analog voltage or tuning voltage which is applied to the variable capacitance diode in the local oscillator of the tuning circuit.

However, the operating characteristic of the variable capacitance diode in the television receiver of this type tends to vary with time, due to, for example, a temperature drift and a secular variation. As a result of such a variation in the operating characteristic of the variable capacitance diode, a deviation of each individual optimum tuning point takes place for the tuning circuit with the corresponding tuning voltage data stored in the tuning data memory, and a clear picture will not be reproduced on the screen of the CRT.

SUMMARY OF THE INVENTION

It is an object of the present invention to provide an improved electronic tuning type television receiver whose tuning circuit can be reliably and accurately tuned to a selected channel regardless of such a variation in the operating characteristic of the variable capacitance diode in the local oscillator of the tuning circuit.

Another object of the present invention is to provide an improved electronic tuning type television receiver in which the digital data indicative of the individual tuning voltages stored initially in the tuning data memory need not be renewed or rewritten later, and the optimum tuning voltage can always be applied to the variable capacitance diode when the corresponding channel is selected.

In accordance with the present invention which attains the above objects, there is provided an electronic tuning television receiver comprising a tuning circuit including a local oscillator whose oscillation frequency is controlled to be variable depending on a voltage applied to a variable capacitance diode, signal input means for specifying a selected channel, memory means for storing a plurality of digital data indicative of tuning voltages corresponding to a plurality of channels respectively so that a tuning voltage corresponding to a selected channel can be applied to the variable capacitance diode in the tuning circuit, means for reading out from the memory means the digital data corresponding to the selected channel specified by the signal input means, a D/A converter converting the digital data read out from the memory means into an analog signal which is applied to the variable capacitance diode, and a tuning detection circuit detecting the fact that the tuning circuit is turned to the selected channel, wherein the improvement comprises tuning voltage control means which functions to sequentially modify, at a predetermined rate, the digital data read out from the memory means to sequentially apply such a signal to the D/A converter, and which ceases its data modifying operation in response to the appearance of an output from the tuning detection circuit.

Various further and more specific objects, features and advantages of the present invention will appear from the description given below, taken in connection with the accompanying drawings illustrating, by way of example, preferred embodiments of this invention.

DESCRIPTION OF THE PREFERRED EMBODIMENTS

Figure 1:
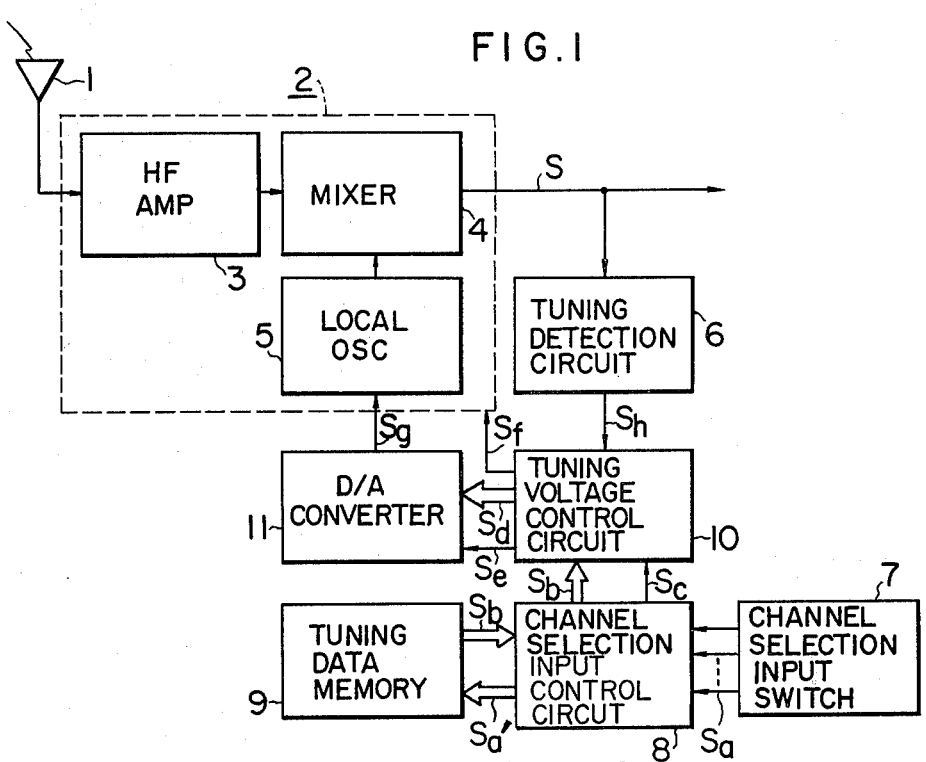
FIG. 1 is a block circuit diagram showing principal parts of a preferred embodiment of the electronic tuning type television receiver according to the present invention.

FIG. 1 is a block circuit diagram showing principal parts of a preferred embodiment of the electronic tuning type television receiver according to the present invention. Referring to FIG. 1, an antenna 1 is connected to a tuning circuit 2. This tuning circuit 2 includes a high-frequency amplifier 3, a mixer 4 and a local oscillator 5. This local oscillator 5 is of a variable frequency oscillation type in which at least one variable capacitance diode is used as its tuning element. A video intermediate frequency signal S appears at the output of the mixer 4 to be applied to a video system including a video intermediate frequency amplifier and a video detector, which are well known in the art and have not any direct concern with the present invention. Therefore, any detailed description of these elements will be unnecessary.

A tuning detection signal $S_h$ appears from a tuning detection circuit 6 when this circuit 6 detects appearance of the video intermediate frequency signal S from the mixer 4. This tuning detection circuit 6 includes, for example, a frequency discriminating circuit connected to the video intermediate frequency amplifier, and the tuning detection signal $S_h$ appears at the output of the tuning detection circuit 6 when the output signal of the frequency discriminating circuit lies within a predetermined voltage range, and the level of the output signal of the video intermediate frequency amplifier is higher than a predetermined setting, with the horizontal synchronizing signal being present at the same time. Such a tuning detection circuit 6 is disclosed in, for example, Japanese Utility Model Application No. 33295/78, filed on Mar. 17, 1978 in the name of Hitachi, Ltd. The electronic tuning television receiver shown in FIG. 1 further comprises a channel selection input switch 7, a channel selection input control circuit 8, a tuning data memory 9, a tuning voltage control circuit 10 which is a characteristic part of the present invention, and a D/A converter 11.

Figure 2:
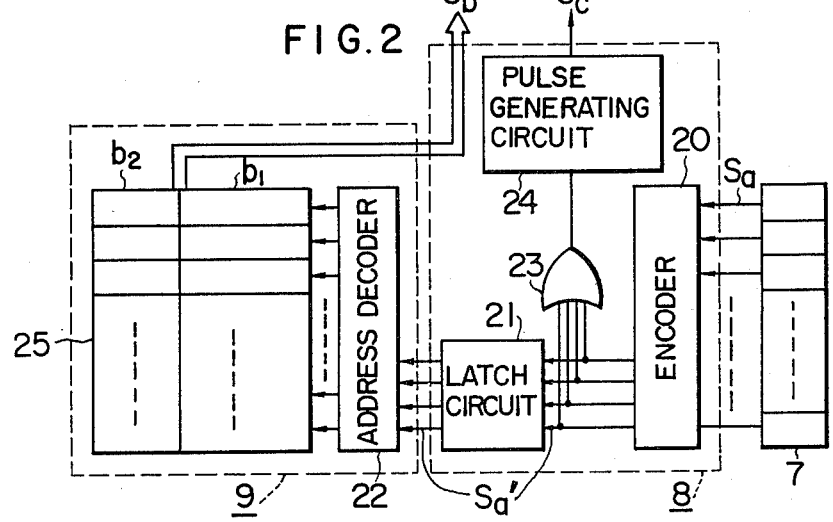
FIG. 2 is a block circuit diagram showing in detail the structure of the channel selection input control circuit and the tuning data memory designated by the blocks 8 and 9 respectively in FIG. 1.

Referring to FIG. 2, the channel selection input control circuit 8 includes an encoder 20, a latch circuit 21, an OR gate 23 and a pulse generating circuit 24, and the tuning data memory 9 includes an address decoder 22 and a data storage 25.

When a channel is selected, a channel selection input signal $S_a$ is applied from the channel selection input switch 7 to the encoder 20 in the channel selection input control circuit 8 to be converted into a corresponding binary-coded signal $S_a'$ which is applied through the latch circuit 21 to the address decoder 22 in the tuning data memory 9.

The data storage 25 in the tuning data memory 9 is in the form of a non-volatile memory which is featured by the fact that data once written therein can be stored permanently unless an erase signal is applied thereto. Data $b_1$ indicative of tuning voltages corresponding to the individual channels and data $b_2$ indicative of either the VHF band or the UHF band are stored in the data storage 25 of the tuning data memory 9. Therefore, when one of the channels is selected by a TV viewer who actuates the corresponding channel selection button of the channel selection input switch 7, access to the corresponding data area of the data storage 25 is provided by the output signal of the address decoder 22, so that a data signal $S_b$ including the tuning voltage data $b_1$ and band data $b_2$ corresponding to the selected channel appears from the tuning data memory 9.

In the channel selection input control circuit 8, the signal portion indicative of the individual bits of the binary-coded output signal $S_a'$ of the encoder 20 are applied to the OR gate 23, and the pulse generating circuit 24 generates a pulse signal $S_c$ including a single pulse when the output signal from the OR gate 23 is in its logic "1". Such a pulse signal $S_c$ appears each time a channel is selected, to be applied to the tuning voltage control circuit 10 as a control starting signal.

Figure 3:
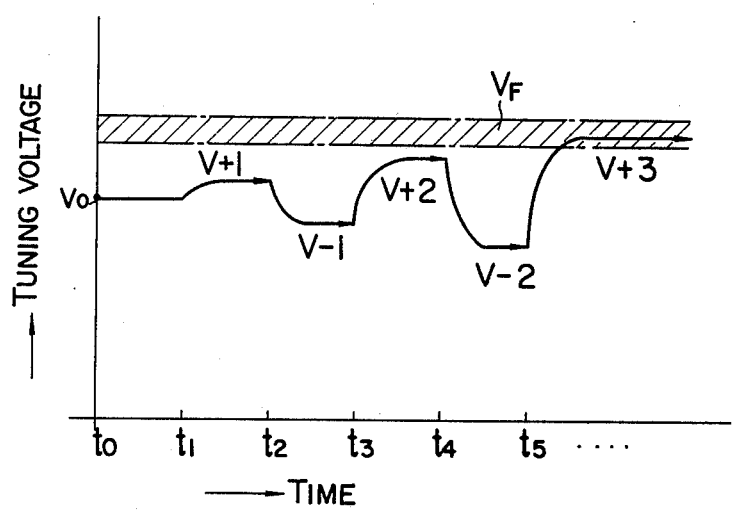
FIG. 3 is a diagrammatic view illustrating the tuning voltage control operation of the tuning voltage control circuit designated by the block 10 in FIG. 1.

According to the present invention, the tuning voltage control circuit 10 controls the tuning voltage so as to modify it in a manner as, for example, shown in FIG. 3. More precisely, when a tuning voltage $V_o$ indicated by a digital data $b_1$ read out from the tuning data memory 9 deviates from a voltage $V_F$ representing the actual tuning voltage range of the tuning circuit 2 for the television receiver as shown in FIG. 3 due to, for example, a secular variation in the operating characteristic of the variable capacitance diode, a predetermined, stepwise increasing value is alternately added to or subtracted from the reference value $V_o$ produced from the read out digital data in the tuning voltage control circuit 10 until finally a proper tuning voltage within the range $V_F$ is applied across the variable capacitance diode, that is, until the optimum tuning point is reached.

Figure 4:
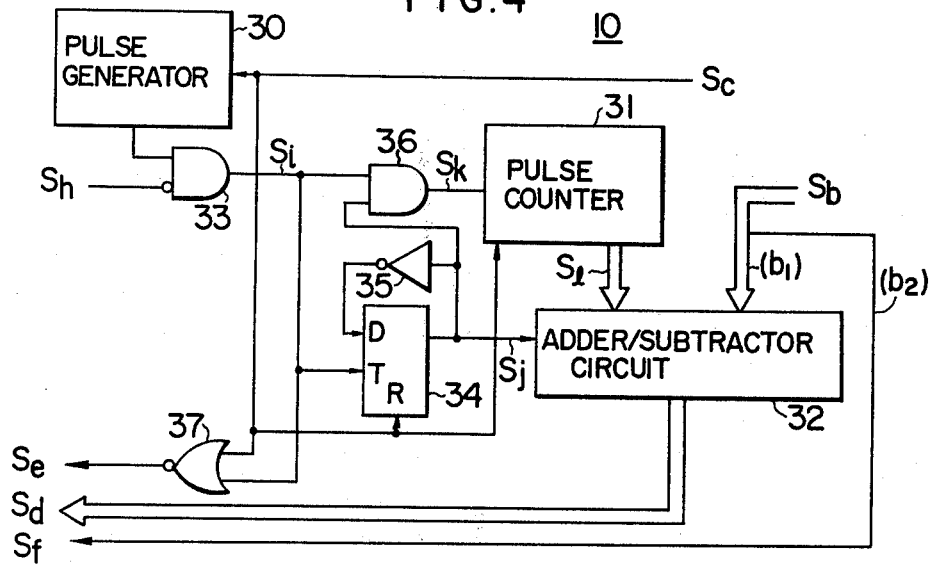
FIG. 4 is a block circuit diagram showing in detail the structure of the tuning voltage control circuit.

FIG. 4 shows the practical structure of one form of the tuning voltage control circuit 10 adapted to carry out such a manner of tuning voltage control. Referring to FIG. 4, the tuning voltage control circuit 10 comprises a clock pulse generator 30 generating a train of clock pulses in response to the application of the control starting signal $S_c$ from the channel selection input control circuit 8, a clock pulse counter 31 counting clock pulses applied thereto, an adder/subtractor circuit 32 adding or subtracting the count output signal $S_l$ of the clock pulse counter 31 to or from the tuning voltage data $b_1$ in the data signal $S_b$, AND gates 33, 36, a flip-flop circuit 34, an inverter 35, and a NOR gate 37. The output signal $S_d$ of the adder/subtractor circuit 32 is applied to the D/A converter 11 shown in FIG. 1. The pulse signal generated from the pulse generator 30 is applied to the AND gate 33 which is controlled by an inverted signal of the tuning detection signal $S_h$, so that the AND gate 33 ceases to provide its output pulse signal $S_i$ after the tuning detection signal $S_h$ has been applied thereto.

The clock pulse signal $S_i$ appearing at the output of the AND gate 33 is applied to the trigger terminal of the flip-flop circuit 34 as a data input timing signal, and the output signal $S_j$ of this flip-flop circuit 34 is fed back to its data terminal through the inverter 35. Thus, the state of the flip-flop circuit 34 is inverted each time a pulse of the pulse signal $S_i$ is applied to its trigger terminal. The output signal $S_j$ of the flip-flop circuit circuit 34 is applied also to the adder/subtractor circuit 32 as an operation mode specifying signal, and depending on the state or level of the output signal $S_j$ of the flip-flop circuit 34, the adder/subtractor circuit 32 alternately adds the count output $S_l$ of the clock pulse counter 31 to the data $b_1$ or subtracts the count output $S_l$ of the clock pulse counter 31 from the data $b_1$, and the resultant digital data signal $S_d$ obtained by the addition or subtraction in the adder/subtractor 32 is applied to the D/A converter 11 (FIG. 1).

The clock pulse signal $S_i$ appearing at the output of the AND gate 33 is applied to the AND gate 36 together with the output signal $S_j$ of the flip-flop circuit 34. Consequently, a clock pulse signal $S_k$ including clock pulses, each of which appears when the signal $S_j$ is in logic "1", is applied to the clock pulse counter 31, so that the count of the clock pulse counter 31 is changed upon completion of both the addition and the subtraction in the adder/subtractor circuit 32.

Both the clock pulse counter 31 and the flip-flop circuit 34 are cleared or reset by the control starting signal $S_c$. The control starting signal $S_c$ is applied, together with the output pulse signal $S_i$ of the AND gate 33, to the NOR gate 37 which generates an output signal $S_e$ which is applied to the D/A converter 11 (FIG. 1) as a data receiving timing signal. The D/A converter 11 receives the digital data signal $S_d$ responsive to rising of the pulse signal $S_e$ and converts this digital data signal $S_d$ into an analog signal $S_g$ which is applied to the variable capacitance diode in the local oscillator 5. The data $b_2$ included in the data signal $S_b$ to specify the frequency band is applied to the tuning circuit 2 as a band specifying signal $S_f$.

Figure 5:
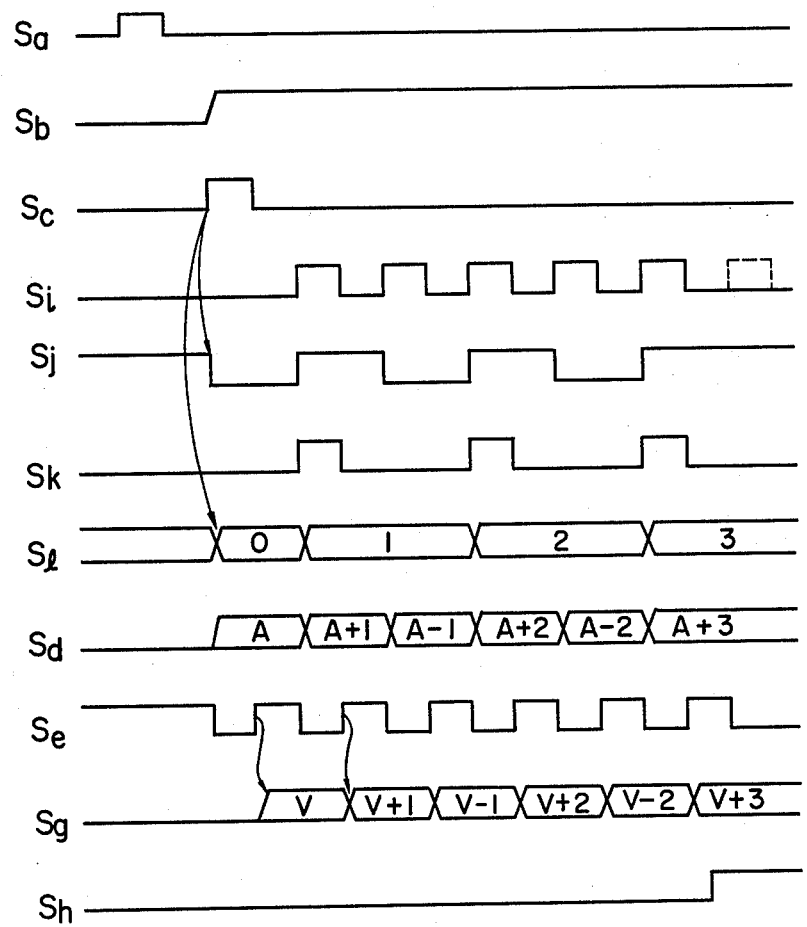
FIG. 5 is a time chart of various signals and data applied to and delivered from the tuning voltage control circuit.

The operation of the tuning voltage control circuit 10 having the construction illustrated in FIG. 4 will be described in further detail with reference to a signal time chart shown in FIG. 5. The data signal $S_b$ including the data $b_1$ and $b_2$ appears from the tuning data memory 9 in response to the application of the channel selection input signal $S_a$ from the channel selection input switch 7 to the channel selection input control circuit 8 and is applied to the tuning voltage control circuit 10 together with the control starting signal $S_c$.

In the tuning voltage control circuit 10, the clock pulse signal $S_i$ appears from the AND gate 33 in response to the application of the control starting signal $S_c$ to the pulse generator 30, and both the flip-flop circuit 34 and the clock pulse counter 31 are reset or cleared responsive to the rising of the control starting signal $S_c$. Thereafter, the output signal $S_j$ of the flip-flop circuit 34 is repeatedly inverted in its level at the rise time of successive pulses of the pulse signal $S_i$, and such a pulse signal $S_j$ is applied to the AND gate 36 together with the pulse signal $S_i$, so that the clock pulse signal $S_k$ representing the logical product of the two input signals $S_i$ and $S_j$ appears at the output of the AND gate 36 to be applied to the clock pulse counter 31. Consequently, the count indicated by the output signal $S_l$ of the clock pulse counter 31 changes at a cycle which is ½ of the cycle of the pulse signal $S_i$. In FIG. 5, the value of the tuning voltage data $b_1$ read out from the tuning data memory 9 is shown by the symbol A. In the adder/subtractor circuit 32, the data indicated by the count signal $S_l$ applied from the clock pulse counter 31 is alternately added to the data $b_1$ and subtracted from the data $b_1$ when the pulse signal $S_j$ is in its logical level "1" and logical level "0" respectively, and the resultant digital data indicated by the output signal $S_d$ of the adder/subtractor circuit 32 applied to the D/A converter 11 is modified in a sequential order of A, A+1, A−1, ..., A+3 as shown. On the other hand, the data receiving timing pulse signal $S_e$, which represents the inverted or negated logical sum of the control starting signal $S_c$ and the clock pulse signal $S_i$, appears from the NOR gate 37 to be applied to the D/A converter 11. Therefore, the tuning voltage data signal $S_d$ is subjected to D/A conversion responsive to rising of successive pulses of the data receiving timing pulse signal $S_e$, and the output signal $S_g$ of the D/A converter 11 representing the modified tuning voltage changes in a sequential order of V, V+1, V−1, ..., V+3 as shown. Suppose that the optimum tuning point is reached when the modified tuning voltage signal $S_g$ represents the tuning voltage value of V+3. Then, the tuning detection signal $S_h$ being logic "1" is applied from the tuning detection circuit 6 to the AND gate 33 in the tuning voltage control circuit 10. Consequently, the clock pulse signal $S_i$ ceases to appear from the AND gate 33 thereafter, and the tuning voltage is fixed at the modified value of V+3.

It will be apparent from the foregoing detailed description of the present invention that the tuning voltage data read out from the tuning data memory is controlled to be variable by the tuning voltage control circuit, so that the tuning voltage to be applied to the variable capacitance diode in the local oscillator can be gradually modified until the optimum tuning point is reached. It is therefore possible to reproduce clear pictures on the CRT even when the tuning voltage data stored in the tuning data memory are not in accord with the actual tuning points due to, for example, a secular variation in the operating characteristic of the variable capacitance diode.

In the form of the tuning voltage control circuit illustrated by way of example, a predetermined value is added and subtracted a plurality of times to and from the tuning voltage value read out from the tuning data memory until the optimum tuning point is reached. However, each individual tuning voltage data may be stored in the tuning data memory in a relation slightly deviating from its initial optimum value and may be monotonously increased or otherwise monotonously decreased until the optimum tuning point is reached. Further, an electronic unit capable of programmed control such as a microcomputer may be used to replace the function of the tuning voltage control circuit as well as that of the channel selection input circuit.

What is claimed is:

1. An electronic tuning type television receiver comprising a tuning circuit including a local oscillator whose oscillation frequency is controlled to be variable depending on a voltage applied to a variable capacitance means, signal input means for specifying a selected channel, memory means for storing digital data indicative of tuning voltages corresponding to a plurality of channels respectively so that a tuning voltage corresponding to a selected channel can be applied to said variable capacitance means in said tuning circuit, means for reading out from said memory means the digital data corresponding to the selected channel specified by said signal input means, a D/A converter converting the digital data read out from said memory means to an analog signal which is applied to said variable capacitance means, and a tuning detection circuit for generating a signal when said tuning circuit is tuned to the selected channel, wherein tuning voltage control means are provided for alternately increasing and decreasing, at a predetermined rate, the digital data read out from said memory means to sequentially apply a signal representative of said alternately increased and decreased data to said D/A converter, and for ceasing the increasing and decreasing operation in response to the appearance of an output from said tuning detection circuit.

2. An electronic tuning type television receiver comprising a tuning circuit including a local oscillator whose oscillation frequency is controlled to be variable depending on a voltage applied to a variable capacitance diode, signal input means for specifying a selected channel, memory means for storing digital data indicative of tuning voltages corresponding to a plurality of channels respectively so that a tuning voltage corresponding to a selected channel can be applied to said variable capacitance diode in said tuning circuit, means for reading out from said memory means the digital data corresponding to the selected channel specified by said signal input means, a D/A converter converting the digital data read out from said memory means to an analog signal which is applied to said variable capacitance diode, and a tuning detection circuit detecting the fact that said tuning circuit is tuned to the selected channel, wherein the improvement comprises tuning voltage control means which functions to sequentially modify, at a predetermined rate, the digital data read out from said memory means to sequentially apply such a signal to said D/A converter, and which ceases its data modifying operation in response to the appearance of an output from said tuning detection circuit, and
wherein said tuning voltage control means comprises means for generating a train of clock pulses, counter means starting to count said clock pulses under control of said means for reading out the digital data from said memory means, and arithmetic operation means for adding or subtracting the count of said counter means to or from the digital data read out from said memory means, the output of said arithmetic operation means being applied to said D/A converter.

3. An electronic tuning type television receiver comprising a tuning circuit including a local oscillator whose oscillation frequency is controlled to be variable depending on a voltage applied to a variable capacitance means, signal input means for specifying a selected channel, memory means for storing digital data indicative of tuning voltages corresponding to a plurality of channels respectively so that a tuning voltage corresponding to a selected channel can be applied to said variable capacitance means in said tuning circuit, means for reading out from said memory means the digital data corresponding to the selected channel specified by said signal input means, a D/A converter converting the digital data read out from said memory means to an analog signal which is applied to said variable capacitance means, a tuning detection circuit generating a signal when said tuning circuit is tuned to the selected channel, means to generate an alternately varying signal to control digital data being read out from said memory to said D/A converter, means to sequentially change the value of said digital data in accordance with said alternately varying signal, and means responsive to said signal at the output of said tuning detection circuit to cease generation of said alternately varying signal.

* * * * *